United States Patent [19]

Goffredo et al.

[11] Patent Number: 4,576,685

[45] Date of Patent: Mar. 18, 1986

[54] PROCESS AND APPARATUS FOR PLATING ONTO ARTICLES

[75] Inventors: Daniel L. Goffredo, Riverton, N.J.; Walter J. Meyer; Horst Bläising, both of Berlin, Fed. Rep. of Germany

[73] Assignee: Schering AG, Berlin, Fed. Rep. of Germany

[21] Appl. No.: 726,049

[22] Filed: Apr. 23, 1985

[51] Int. Cl.⁴ ............................................. C25D 5/54
[52] U.S. Cl. ................................... 204/30; 204/43.1; 204/44; 204/44.4; 204/44.5; 204/44.6; 204/45.1; 204/47; 204/48; 204/49; 204/52 R; 204/53; 204/54 R; 204/198; 204/46 R; 204/46 G; 427/97; 427/98; 427/301; 427/304; 427/305
[58] Field of Search ............... 204/15, 20, 22, 24, 204/27–28, 30, 44.4, 44.5, 44.6, 43.1, 44, 45.1, 46.1, 47.5, 47–49, 52 R, 52 Y, 53, 54 R, 54 L, 207, 198; 427/97–98, 301, 304, 305

[56] References Cited

U.S. PATENT DOCUMENTS

3,801,478 4/1974 Heger et al. ........................... 204/30
3,954,570 5/1976 Shirk et al. ........................... 204/30

Primary Examiner—R. L. Andrews
Attorney, Agent, or Firm—Paul & Paul

[57] ABSTRACT

A process and apparatus is provided whereby metal is deposited onto articles such as plastics, ceramics and the like for producing printed circuit boards, metal plated ceramics, shielded articles and other plated articles, as part of a generally or substantially continuous process. Prior to plating, also as part of a continuous process while the boards are being generally continuously and horizontally conveyed in horizontal orientation, they are prepared to accept copper on their non-metallic portions, by application of a chemical reducing solution thereto, preferably after previously having been provided with a chemical activation solution thereto. Then the boards are transferred to a vertical orientation and conveyed in vertical orientation through an electroless copper deposition bath, at a reduced rate of travel, during with a copper solution adheres to the thus treated non-metallic portions of the boards, and to the metallic portions of the boards as well. After the plating process is completed in the bath, the boards are preferably retransferred to generally horizontal orientation and conveyed through appropriate completion steps, such as cleaners, rinsers, anti-tarnish steps, dryer steps and the like, with preferably uniform thin copper coatings thereon, and thereafter the boards are subsequently plated with a thicker copper coating, preferably by means of an electroplating process.

21 Claims, 4 Drawing Figures

PROCESS AND APPARATUS FOR PLATING ONTO ARTICLES

BACKGROUND OF THE INVENTION

In the preparation of printed circuit boards for the electronics industry, it has become commonplace to provide multi-layer boards, two-sided boards, or the like, with through-holes therein, for attachment of various electronic components therethrough. Such attachment is generally by means to assure good electrical conductivity. In the course of this, it has become desirable to provide for electrical conductivity from one surface through board through-holes to an opposite surface of the board. To this end, it is desirable to coat the through-holes with a metallic coating, preferably copper. Due to the nature of construction of most printed circuit boards; i.e., being a laminate, comprising a sandwich of generally a central core of plastic resin impregnated with fiberglass strands, in one or more layers, with exterior surface layers of copper sheeting, it has been necessary to find ways to connect the copper sheeting layers on the surfaces of the printed circuit boards, one to the other, and this is preferably done by coating the through-holes. It is known to provide a chemical preparation to the through-holes so that they will more readily accept copper applied thereto.

As industrial operations generate the need for more rapid production of printed circuit boards, processes have been developed for the continuous, or substantially continuous production of printed circuit boards. For example, in U.S. Pat. No. 4,015,706, a process is disclosed for treatment of printed circuit boards as they are horizontally conveyed from one station to another, in horizontal orientation, and such an arrangement is satisfactory for most of the cleaning, rinsing, etching, drying, processes and the like.

However, the plating of copper onto printed circuit boards, and especially the electroless plating in instances in which circuit boards are otherwise being treated as they travel through various stations, has heretofore required a substantially longer treatment process than the other treatments mentioned above, requiring substantially large apparatus, taking up large amounts of industrial manufacturing space, if the electroless plating operation is to be done as part of a continuous, or substantially continuous process.

SUMMARY OF THE INVENTION

The present invention is directed toward an electroless plating operation, which substantially reduces the overall length of the printed circuit board production line, but which enables the process to be accomplished continuously, or substantially continuously, as part of a single production operation. In accordance with the present invention, which is broader than printed circuit boards and encompasses metal deposition onto plastics, ceramics, and other surfaces, for electrical conductivity, electrical shielding and many other functions, the various preparatory steps are practiced as the boards (or other articles which will be understood to comprise generally substantially flat sheets of material of limited flexibility) are conveyed in horizontal orientation, but then the boards are moved into vertical orientation during the substantially more time-consuming plating operation, during which operation they are again substantially continuously conveyed, but at a reduced rate of travel, and thereafter the boards are again re-oriented to generally horizontal orientation, during which they are again continuously or substantially continuously conveyed through subsequent rinsing, anti-tarnish, drying operations and the like. Thus, the over-all process remains substantially continuous, but by maintaining the boards in generally vertical orientation during the plating process, in which they are much closer together physically than during the other processes, they can travel at a reduced rate of speed while maintaining the overall processing rate of the entire system, from beginning to end, substantially the same.

The boards may subsequently have additional plating applied thereto, preferably in an electroplating operation, with suitable preparation and finishing operations likewise taking place in relation thereto.

Aside from being printed circuit boards, the articles being treated may take other forms, such as the metallic plating of ceramics, the metal plating or shielding of plastic or like components of electronic equipment, of electric computing equipment, or other applications for shielding of plastics or the like, as well as for plating other articles of different kinds. Also, the thin coating of metal that is electrolessly applied need not be limited to copper, but may be nickel, cobalt, gold, silver, or various alloys, and a subsequent plating operation may involve a thicker coating of these and/or other metals, preferably electrolytically applied.

This invention allows for a lower incidence of rejects as articles are more uniformly handled, a lower incidence of oxidation in that they can substantially continuously go from treatment to treatment without interruption and the incident time delays that would permit oxidation, and for reduced labor costs as well due to the substantially continuous nature of the process.

Accordingly, it is the primary object of this invention to provide a novel process for electroless deposition of metal onto articles.

It is a further object of this invention to provide a novel apparatus for electroless deposition of metal onto articles.

It is another object of this invention to provide a novel process for electroless deposition of copper or other metals onto printed circuit boards or other articles, either separate from, or combined with a subsequent plating operation of either the electroless or electrodeposition types.

It is another object to provide a novel apparatus for electroless deposition of copper or other metals onto printed circuit boards or other articles, either separate from, or combined with a subsequent plating operation of either the electroless or electrodeposition types.

Other objects of this invention include the deposit of a metallic conductive coating onto essentially non-metallic surfaces and the like.

Other objects and advantages of the present invention will become readily apparent to those skilled in the art from a reading of the following brief descriptions of the drawing figures, detailed description of the preferred embodiment and the appended claims.

DETAILED DESCRIPTION OF THE PREFERRED EMBODIMENT

Figures 1, 2, 3:
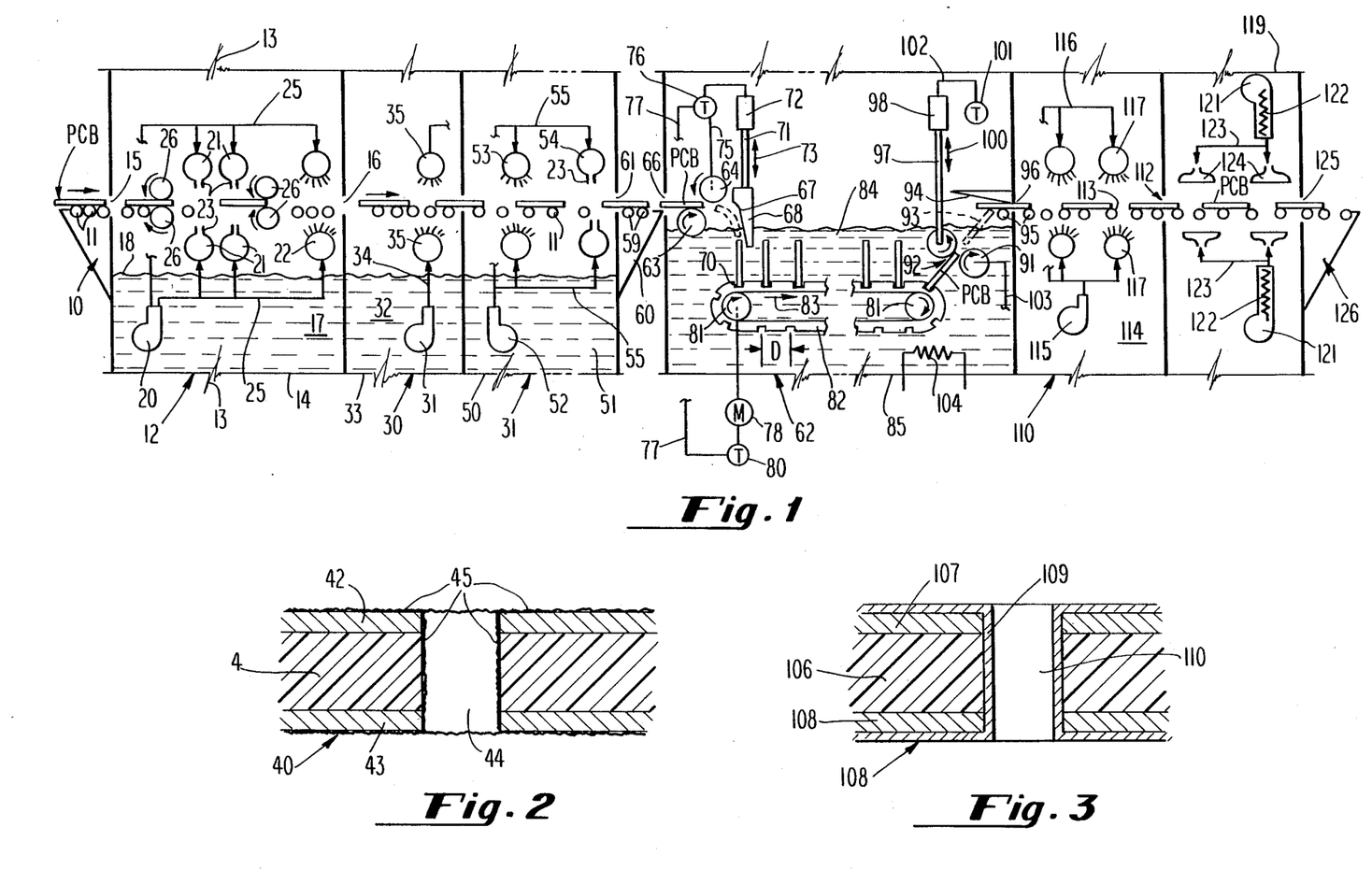
FIG. 1 is a schematic side elevational view of various stations in the processing system, with a number of those stations being fragmentally illustrated to simulate a plurality of different processing stations, in accordance with this invention, with the flow of the articles being treated (printed circuit boards) through the process being from left to right.
FIG. 2 is an enlarged fragmentary cross-sectional view taken through a printed circuit board in accordance with a preparation step of this invention, especially the chemical reduction step.
FIG. 3 is a view similar to that of FIG. 2, but wherein the application of copper to a through-hole of the printed circuit board after the plating step, is illustrated.

Referring now to the drawings in detail, reference is first made to FIG. 1, wherein a preferred embodiment of this invention, that includes the electroless deposition process, is illustrated as comprising a plurality of stations.

Viewing the apparatus of FIG. 1 from left to right, it will be seen that there is first an input station generally designated by the numeral 10, in schematic vertical longitudinal sectional illustration, with the input unit 10 being adapted to receive unplated articles (printed circuit boards PCB in the preferred embodiment) on an input surface thereof, for travel from left-to-right through the equipment of FIG. 1, as illustrated.

The input unit may be constructed along the lines of the input module disclosed in U.S. Pat. No. 4,015,706, the entire disclosure of which is herein incorporated by reference, to travel along a predetermined path comprised of rotating wheels 11, or like rotatable members. The printed circuit boards are then delivered to one or more preparation stations or modules, collectively designated by the numeral 12 as indicated by broken schematic lines 13. The stations 12 may comprise desmear stations, for applying chemicals to the printed circuit boards for eliminating grease or other smears thereon, and/or for treating the surfaces to prevent smearing thereof. Additionally, the stations 12 may comprise one or more rinsing stations, and one or more etch-back stations. It will also be understood that the roller members 11, throughout the apparatus of FIG. 1 are all preferably driven from a common drive, as disclosed in U.S. Pat. No. 4,015,706, to convey the printed circuit boards PCB from left to right through the apparatus.

The stations 12 will generally comprise tanks 14 having inlet and outlet openings 15 and 16, preferably slit-like in nature, and which may or may not be provided with flexible flaps (not shown) thereover, to prevent passage of undesirable amounts of fluids into and out of such openings, and otherwise the stations 12 are adapted to contain applied liquids 17 therein, at some predetermined level 18.

With reference to illustrative stations 12 once again, it is seen that a pump 20 (generally electrically operated) is provided for pumping a desired desmearing, rinsing, etching or the like solution through suitable applicators of either the flood bar type 21, or of the spray bar type 22. Where the applicators are of the flood bar type, then they will generally be provided with elongated channels 23 running completely across the apparatus in a transverse direction, to provide a curtain or screen of applied liquid. Where the applicators are of the spray type 22, they may be constructed, for example, in the manner of the spray bars of U.S. Pat. No. 3,905,827, the disclosure of which is herein incorporated by reference, or in any other manner, but generally, once again, will extend across the apparatus in a transverse direction, and be provided with outlet apertures for spray of liquid that has been delivered thereto from the pump 20, via delivery conduits 25. It will also be noted that a plurality of hold-down rollers 26 may be utilized, to maintain the printed circuit boards PCB on the upper surface of the conveyors or other rotating members 11, as they are being subjected to spray or other delivery of a treatment liquid from the spray nozzles 20, or flood bars 21, during passage of the printed circuit boards PCB in a longitudinal direction through the apparatus of FIG. 1.

After the printed circuit boards PCB have been treated in chambers such as those 14, by preliminary preparation techniques, they are then preferably delivered into one or more activation chambers 30, likewise connected, preferably for common drive with the other modules or stations aforesaid, whereby a chemical activation solution would preferably be provided to the printed circuit board PCB prior to providing a chemical reducing solution thereto in one or more subsequent stations, apparatus or modules 31.

At station 30, the chemical activation solution will be provided, while the printed circuit board is moving along its predetermined path, generally by means of a pump 31 delivering the same from a sump 32 in the bottom of a chamber 33, via delivery conduits 34, to suitable sprayers 35 or the like. It will be understood that, in lieu of sprayers 35, flood bars may be desired.

Preferably, the activation solution provided at station 30 may be an alkaline palladium solution known by the Schering A.G. trade name NEOGANTH that works on an ion palladium process. The solution may be comprised to have a ph in a range of 7–12 and an operating temperature of 20 degrees C. to 50 degrees C.:

| palladium chloride | 10–400 milligrams/liter of palladium; |
|---|---|
| sodium hydroxide | 3–20 grams/liter; |
| boric acid | 5–25 grams/liter; |
| complex builder | 5–100 grams/liter. |

With particular reference to FIG. 2, a printed circuit board 40 is illustrated, having an inner layer 41, generally of fiberglass-impregnated plastic resin construction, with copper exterior surface layers 43 thereon (and, if desired, one or more interior copper layers, not shown), and non-exterior portion 44 that is comprised of a through-hole, from one exterior surface 42 to the other 43, through the printed circuit board 40. In this illustration, the activation solution 45 is shown in process, preparing the printed circuit board, and preferably its through-hole portions 44, that are not provided with a copper coating, for receipt of a reducer solution thereon.

With reference to station 31, it is seen that a reducer solution is provided from a sump 51 at the bottom of a tank 50 (again schematically illustrated to comprise either one or a plurality of tanks, depending upon the number of and types of processes desired to be used at this point), with the reducer solution being delivered from pump 52 in the sump 51, to spray nozzles 53, or flood bars 54, as desired, via delivery conduits 55.

The chemical reducer or reduction solution being applied to the printed circuit boards as they are delivered longitudinally through the stations 31, is also schematically illustrated in FIG. 2, in the same manner as aforesaid with respect to the activation solution.

The reducer solution will preferably reduce the complexed palladium to metallic palladium to promote rapid copper coverage during the subsequent plating operation. The particular reducing solution may comprise one that is known by the Schering A.G. trademark NEOGANTH. The reducer solution may be comprised as follows, to have a ph in a range of 8-12, and an operating temperature of 20 degrees C.-60 degrees C.:

| sodium borohydride | 0.1-5 grams/liter; |
|---|---|
| sodium hypophosphate | 10-80 grams/liter; |

It will be understood that the operation of the process through the various stations described above will be during substantially continuous delivery of printed circuit boards through the apparatus, and that the apparatus may at various locations comprise inspection modules located in the delivery line between the various stations, as well as drive modules, and may comprise an outlet module 60, to which the printed circuit boards are delivered as they pass out the outlet opening 61 of the last processing module prior to their delivery to a plating module or station 62.

Just prior to, or at the commencement of delivery of the printed circuit boards serially to the plating station 62, they are transferred from their generally flat horizontal orientation to a generally vertical surface-facing-surface parallel orientation by any suitable means that will effect the preferably rapid transfer. With respect to station 62, one such means is illustrated, as comprising the delivery of the printed circuit boards from rotatable elements 59 of the output station 60, to a location between the nip between a pair of opposed rotating rollers 63 and 64, preferably driven by means of the same common drive (not shown) that drives the rotatable elements 11, 59, through the various stations aforementioned. The rollers 63 and 64 are arranged such that as the printed circuit board is caught in their nip 65, the left-most ends 66 of the printed circuit boards will be tilted upwardly, whereby they are delivered through the nip 65 in a downwards direction as illustrated in phantom at the left-most end of station 62. While being thus delivered, the printed circuit boards will strike a curved surface 67 for camming the printed circuit boards serially into slots 70 of a driveable continuous conveyor belt 82 or the like. The camming member 68 is carried by a push rod 71, that in turn is driven by a cylinder 72, for movement upwardly or downwardly as seen by the double-headed arrow 73, to move the camming member 68 into and out of position rapidly, so as not to interfere with the rightward movement of a just-vertically positioned printed circuit board deposited into slot 70 and held therein by frictional contact with the sides of the slot.

The activation of the cylinder 72 may be controlled from the roller 64, by means of a suitable presence-detector that operates via signal line 75, through a timer or other suitable control device 76, to control the proper timing of operation of the cylinder 72 so that the camming member 68 is into and out of position at the proper time. This control of the operation of the cylinder 76 may be electrical, pneumatic, hydraulic or the like, and may be timed, if desired, to coordinate via control line 77, with the timing of the drive of a motor 78, again through a suitable timing device 80, if desired, which in turn can control the clockwise rotation of a drive roller 81 at the left-most end of the conveyor belt 82.

With a printed circuit board thus then in vertical disposition and with the camming member 68 moved upwardly out of an interference position between adjacent slots 70 on the upper run of conveyor belt 82, the printed circuit board just-then deposited into conveyor belt slot 70 may be moved rightwardly, in the direction of arrow 83, through a plating bath 84, at a desired rate of travel, less than the rate of travel of the printed circuit board through stations 12, 30, 31, for example.

It will be noted that the longitudinal length of the conveyor belt 82 will be pre-established to provide the desired residence time of printed circuit boards in the bath 84 of station 62, in accordance with the desired thickness of plating that is to occur within the chamber 85 of the station 62.

It will be noted that the motor 78 may drive the mechanism which provides for the horizontal movement of the vertically disposed plates through the station 62, either continuously, or substantially continuously. If the movement is continuous, it would be necessary to very precisely coordinate the upper withdrawal of the camming member 68, and to precisely time the proper positioning of the presence of the transverse slots 70 in the belt 82, to receive the printed circuit boards being deposited thereinto. However, a substantially continuous horizontal movement of vertically oriented plates within the bath may be provided, by a continuous stop-and-go movement, whereby the belt 82 will momentarily stop each time a transverse slot 70 thereof reaches a top dead center position on roller 81, with the camming member 68 in the position illustrated in FIG. 1, to precisely move the printed circuit board into the slot 70 as it is driven there by the rollers 63 and 64. Then, as soon as the printed circuit board is in place in slot 71, substantially instanteously thereafter, the cylinder 72 will withdraw the camming member 68, and as soon as the camming member 68 is clear of the upper end of a then-vertically disposed printed circuit board, the motor 78 may again recommence movement of the upper run of the belt 82 in a longitudinal left-to-right direction as viewed in FIG. 1, indexing the same for a movement of the amount "D", the distance between adjacent slots 70, at which point the motor 78 will stop, stopping the movement of the belt and of all vertically disposed printed circuit boards carried thereon, so that the camming member 68 can be driven downwardly by the cylinder 72, to once again assume a camming position for facilitating entry of a next-following printed circuit board into a next-following slot 70. Thus, such an operation, while technically being a stop-and-go movement, similar to a clock mechanism movement, is substantially continuous. It will also be understood that the precise means for effecting movement of vertically-disposed printed circuit boards through a bath 84 may vary, if desired from the particular belt arrangement illustrated, and may comprise any suitable continuous or substantially continuous drive mechanism. Also, it will be understood that the particular apparatus discussed above, such as the rollers 63, 64 and the camming member 68, and related components, are merely one possible arrangement for orienting the printed circuit boards from the horizontal to the vertical disposition.

As the printed circuit boards are delivered toward the right-end of the tank 85, they may be transferred from a vertical orientation to a horizontal orientation, by any suitable re-orienting mechanism. In FIG. 1, one such mechanism is illustrated as comprising a pair of opposed rollers 90, 91, driven to form a nip 92 therebetween, for engaging a printed circuit board delivered therebetween, with the roller 91 being driven clockwise as illustrated in FIG. 1 and with the roller 90 being driven in a counter-clockwise direction, to lift a printed circuit board PCB thereinto, out of its notch on the upper run of belt 82, as illustrated in phantom at 93, to again engage a camming surface 94. The camming surface 94 may be a stationary one, to guide the printed circuit board onto rotatable elements 95 at the outlet end of chamber 85, through an outlet opening 96 therein.

It will be noted that the roller 90, in the arrangement illustrated, is carried by a suitable push/pull rod 97, which in turn is driven by a suitable cylinder 98, for movement upwardly and downwardly in the direction of the double-headed arrow 100, into and out of position, in much the same manner as the upward and downward movement of the camming member 68, to allow passage of vertically disposed plates therepast, just prior to entering the nip 92. It will also be apparent that suitable timing means 101 may be used, connected to the cylinder 98, and interconnected with the drive roller 91, via suitable control connection lines 102, 103, for coordination of drive of rollers 90, 91 with the upward and downward movement of rod 97.

It is also preferably desirable to provide a means for heating the bath 84 in the chamber 85, either by an electrical or a steam heater or the like 104, to maintain the bath 84 at a desired temperature.

The bath 84 is comprised of an electroless copper solution which may be a solution sold by Schering A.G. under the trade name PRINTOGANTH, for depositing the desired thickness of electroless copper on printed circuit boards during their residence time within the bath.

When the bath is a copper solution, it may be comprised as follows, to have a ph in a range of 10-13.5, and an operating temperature in a range of 20 degrees C.-70 degrees C.:

| | |
|---|---|
| cupric chloride | 1-15 grams/liter; |
| ethylene diamine tetra acetic | 5-25 grams/liter; |
| sodium hydroxide | 5-15 grams/liter; |
| formaldehyde | 3-10 grams/liter; |
| deposition rate | 2-10 microns/hour. |

It will be understood that other metals may be deposited by the bath 84, instead of an electroless copper solution, such as electroless solutions of nickel, cobalt, silver, gold, or any of numerous alloys. For example, when the bath 84 is comprised of a nickel solution, it may be comprised as follows, to have a ph in the range of 4-10, and an operating temperature of 20 degrees C.-95 degrees C.:

| | |
|---|---|
| nickel sulfate | 5-50 grams/liter; |
| sodium hydrophosphite | 10-50 grams/liter; |
| ammonia | 1-50 grams/liter; |
| sodium hydroxide | 1-10 grams/liter; |
| complex builder | 20-80 grams/liter; |
| (tartrates such as sodium lactate or sodium acetate) | 20-80 grams/liter; |
| stabilizer | 0.01-5 grams/liter; |
| deposition rate | 5-25 microns/hour. |

With reference to FIG. 3, a printed circuit board 105 is illustrated as comprising an intermediate fiberglass-reinforced plastic resin core 106, with copper surfaces 107 and 108, and with a copper coating 109 extending through a through-hole 110 between opposed surfaces 108, with the copper coating from the station 62 also being applied to the copper surfaces 107 and 108. The length of the through-hole through the board 105 will ordinarily be many times its diameter; not as shown in the non-scale illustration of FIG. 3.

After leaving the station 62, the printed circuit boards, now once again in horizontal orientation, are delivered to suitable processing stations, for effecting rinsing, anti-tarnish fluid application, subsequent rinsing and like operations, generally then followed by a drying operation. In the illustration of FIG. 1, station 110 schematically illustrates an arrangement for such rinsing, anti-tarnish, and subsequent rinsing operations, as comprising a chamber 111 having suitable inlet 96 and outlet 112, and being provided with driven rotatable elements 113 (preferably driven by the same drive that drives the rotatable elements 11, 59, etc., for the several stations prior to the plating station 62). In a sump 114 in chamber 111, a pump 115 delivers a suitable rinsing, anti-tarnish liquid or the like, via suitable delivery conduits 116, to suitable spray apparatus 117 (which may be replaced with flood bars, if desired), for suitable wet processing of printed circuit boards during their passage through the station or stations 110. Then, the printed circuit boards are delivered, preferably through chamber 119 of drying station 120, whereby air pumps or fans 121 or the like, having heating elements 122 associated therewith may deliver heated air via suitable conduits 123, through suitable hoods 124, to printed circuit boards PCB being carried therebetween to discharge at 125, to a discharge station 126.

Figure 4:
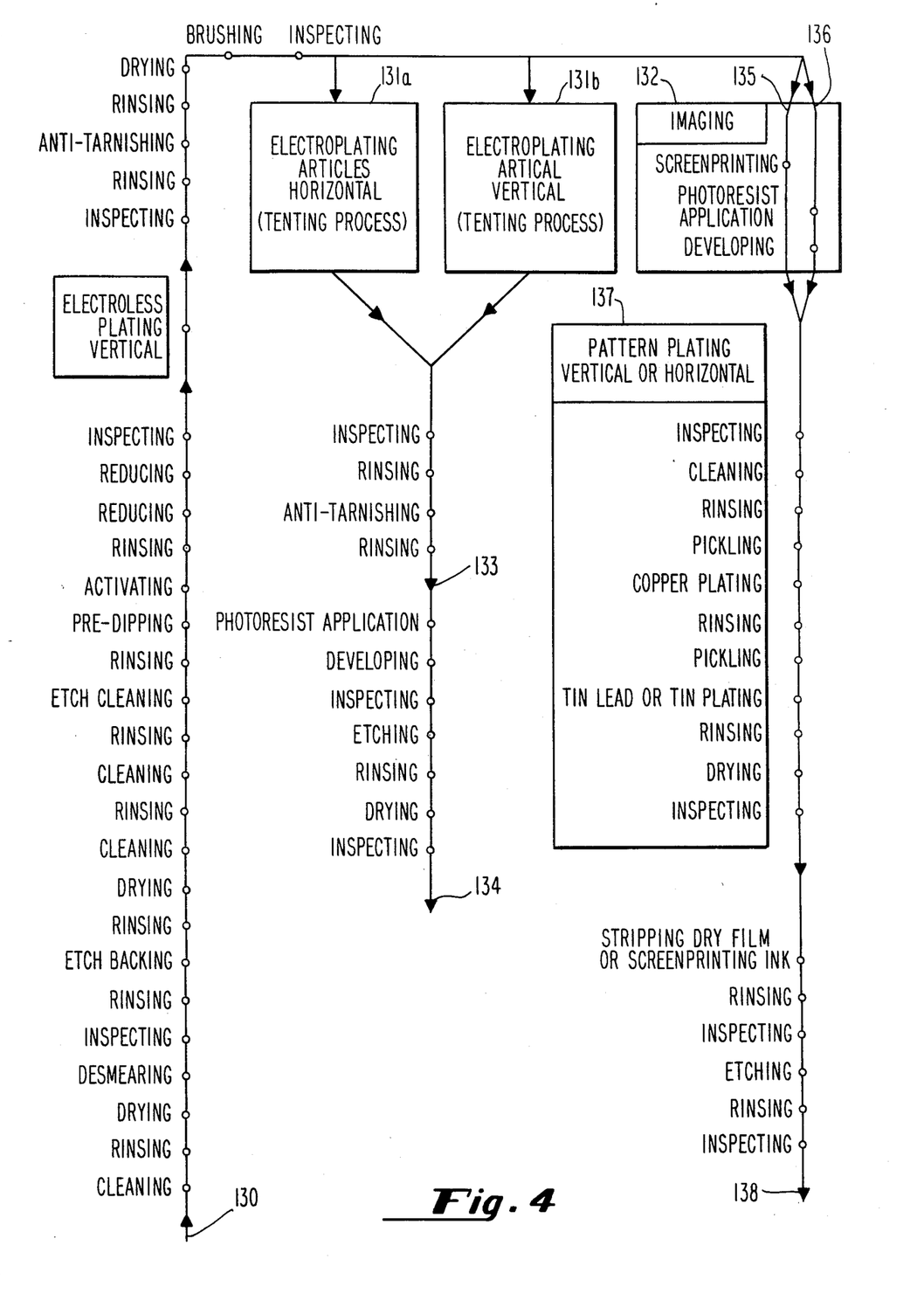
FIG. 4 is a schematic flow diagram of a number of processing steps or stations that may be practiced in accordance with this invention.

With particular reference now to FIG. 4, there is illustrated an overall processing arrangement for articles being treated in accordance with the present invention. It will be understood that the display of steps or stations of FIG. 4 is not intended to be a complete display of the same in connection with any particular article to be processed, nor does the display of FIG. 4 necessarily show the fewest possible such steps or stations, but it does illustrate some representative steps or stations. Commencing with the direction of flow indicated by the arrow 130, it is seen that a first representative step for the articles being treated would be cleaning, followed by rinsing, and then drying, desmearing, inspecting, and rinsing; etch backing, rinsing, drying, cleaning, rinsing, cleaning, rinsing, etch cleaning; then etching (in the case of a printed circuit board, such as a plastic or ceramic member), followed by successive rinsing, pre-dipping, activating, rinsing, reducing, reducing, and inspecting steps. In the case of a series of operations performed in modules, it may be commonplace at some point in the line to provide a drive module, having the function of driving all of the connected-together modules (or stations), from a common source. Following the last inspecting step, the articles may be delivered to the electroless plating operation described above. Thereafter, there may follow inspecting, rinsing, anti-tarnishing, rinsing, drying, brushing and inspecting functions. The articles may then (or at any point after the electroless plating, if desired), optionally undergo an electroplating process (articles either horizontal as at 131a or vertical as at 131b), or an imaging process 132, if desired. After electroplating, the articles would ordinarily undergo suitable subsequent operations, such as inspecting, rinsing, anti-tarnishing, rinsing, and proceed in the direction of arrow 133 to undergo photoresist application, developing, inspecting, etching, rinsing, drying and inspecting operations, and then be delivered to discharge, as shown at the location of arrow 134 in FIG. 4.

If the articles are to undergo an imaging process as at 132, they may undergo a screenprinting operation along path 135, or photoresist and developing operations along path 136, to be delivered then to a pattern plating sequence 137 (vertical or horizontal) to be subjected to inspecting, cleaning, rinsing, pickling, copper plating, rinsing, pickling, tin lead or tin plating, rinsing, drying and inspecting functions. Thereafter, the articles may undergo a stripping of dry film or screenprinting of ink, followed by rinsing, inspecting, etching, rinsing, and inspecting operations, to be discharged at 138.

It will be understood that, as aforesaid, the articles being treated here may comprise plastics, ceramics, or other generally non-metallic articles, for making not only printed circuit boards, but other plated articles, including shielding and the like. Where the present invention is used to apply metal to ceramics, such can be used to construct electronic circuitry for use, for example, under conditions of high-temperature application. Where the process and application of the present invention is used for the shielding of articles, such may be done for the purpose of reducing electromagnetic interference from electric or electronic equipment, by coating plastic surfaces of articles, such as front, rear and side panels from which articles are manufactured, or by coating any other articles that are desired to be shielded, such as plastic articles, fiberglass impregnated plastic articles and the like, with metallic coatings. Such coatings may comprise a combination of electroless coatings in the manner described above, separate or together with electroplated coatings as well.

In accordance with the present invention, when electroplating is to be employed, such may be done in either a continuous manner or in a discontinuous manner (such as in a batch process), although it will be preferred to accomplish the electroplating in a continuous manner. In accordance with the above, reference is made to the disclosures of U.S. Pat. Nos. 4,402,799 and 4,402,800, in a case where the boards are vertically disposed, or may be in accordance with U.S. Pat. No. 4,385,967 in which the boards are electroplated while horizontally disposed. The disclosures of each of these patents are herein incorporated by reference. It will also be apparent that other suitable apparatus may also be used for accomplishing this aspect of the purpose of the present invention of electroplating with the boards in either horizontal or vertical disposition.

The electrolytes that are used in accordance with electroplating, pursuant to the present invention may comprise baths of copper, tin, lead, cobalt, iron, silver, gold, palladium, or various alloys, for example. When the electrolyte is of copper, it may be comprised as follows, and may have an operating temperature in the range of 20 degrees C.–50 degrees C.:

| | |
|---|---|
| copper sulfate | 25–250 grams/liter; |
| sulfuric acid | 50–400 grams/liter; |
| sodium chloride | 40–100 milligrams/liter; |
| brightener | 1–10 grams/liter; |
| surfactant | 0.1–10 grams/liter; |
| current density | 0.5–10 amps/decimeter$^2$. |

Where the electrolyte bath that is employed for electroplating in accordance with this invention is to be nickel for example, the bath may be comprised as follows, and may have an operating temperature in the range of 20 degrees C.–70 degrees C.:

| | |
|---|---|
| nickel sulfate | 100–300 grams/liter; |
| nickel chloride | 50–200 grams/liter; |
| boric acid | 10–50 grams/liter; |
| brightener | 0.5–10 grams/liter; |
| surfactant | 0.1–10 grams/liter; |
| current density | 0.5–10 grams/liter. |

It will thus be apparent that the present invention may be utilized in virtually any environment in which a metallic conductive coating is desired on another article.

It will be apparent that, in performing many of the preparation functions and in performing many of the other functions subsequent to the plating function, many mechanisms and apparatus from existing technology may be utilized. For example, various spraying, pumping and sump operations from U.S. Pat. No. 3,905,827 may be utilized; various etching and filtering functions may be utilized from U.S. Pat. No. 3,776,800; various etchant removal techniques such as those from U.S. Pat. No. 3,801,387 may be utilized. Also, various drying techniques such as those from U.S. Pat. No. 4,017,982 may be utilized; additionally, the various processing stations of this invention may be embodied in modules that are connected together in the same manner and with a common drive, in accordance with the principles of U.S. Pat. Nos. 4,015,706 and 4,046,248.

Furthermore, other modifications and variations in the process will be understood to be within the purview of the present invention, as defined in the appended claims.

What is claimed is:

1. A process for deposition of metal onto surfaces of generally flat articles, comprising the steps of:
    (a) providing the articles with at least some generally flat exterior surfaces having portions generally of non-metallic surface construction;
    (b) continuously and serially delivering the articles along a predetermined path;
    (c) preparing the articles for electroless metal deposition on surface portions as they are continuously delivered along their predetermined path, by application of at least one chemical solution and at least one rinse thereto;
    (d) wherein the delivering step includes moving the articles in generally flat horizontal orientation along a generally horizontal path at a first rate of travel for at least a portion of the travel of articles along their predetermined path prior to the delivery of articles into an electroless deposition bath;
    (e) transferring the articles from generally flat horizontal orientation to generally vertical orientation as they are delivered along their predetermined path; and (f) substantially continuously moving the articles in serial surface-facing-surface relation while in their generally vertical orientation along a generally horizontal path through a bath of electroless metallic solution at a second rate of travel substantially slower than the first rate of travel, to apply a thin metallic coating thereto.

2. The process of claim 1, including the step of transferring the articles from generally vertical orientation to generally flat horizontal orientation, after their travel through the bath.

3. The process of claim 1, including the subsequent steps of at least rinsing and drying the articles as they travel along their predetermined path, and while they are moving substantially continuously at a rate of travel at least as great as the first rate of travel.

4. The process of claim 1, wherein the articles are printed circuit boards having at least some through-holes having non-metallic surface portions.

5. The process of claim 1, wherein the electroless metallic solution is a solution of metal selected from the group of metals consisting of copper, nickel, cobalt, silver, gold and alloys of any of them.

6. The process of claim 2, including the steps of rinsing the articles after their transfer back to generally horizontal orientation and drying the articles, as they travel along a generally horizontal path, while being in generally flat horizontal orientation, and while they are moving substantially continuously at a rate of travel at least as great as the first rate of travel.

7. The process of claim 1, including the electroplating step of applying a metallic coating to the thin metallic coating that was applied in the electroless bath, by delivering the articles through an electroplating solution.

8. The process of claim 7, wherein the electroplating solution is a solution of metal selected from the group of metals consisting of copper, tin, lead, nickel, cobalt, iron, silver, gold, palladium, and alloys of any of them.

9. The process of claim 7, wherein the electroplating step includes serially and substantially continuously conveying the articles through an electroplating bath.

10. The process of claim 1, wherein the step of preparing the articles includes application of a chemical reducer solution to at least the non-metallic surface portions of the articles to promote metal coverage thereon.

11. The process of claim 10, wherein the step of preparing the articles includes application of a chemical activator solution onto at least the non-metallic surface portions of the articles prior to the application of the reducer solution thereto.

12. The process of claim 4, wherein the step of preparing the boards includes application of a chemical activator solution comprising palladium chloride, sodium hydroxide, boric acid, and a complex builder to at least the non-metallic surface portions of the boards, followed by the step of applying a chemical reducer solution comprising sodium borohydride and sodium hypophosphate to at least the non-metallic surface portions of the boards to promote copper coverage thereon, wherein the electroless metallic solution is a solution of cupric chloride, eythylene diamine tetra acetic acid, sodium hydroxide, formaldehyde and a stabilizer, including the step of transferring the boards from general vertical orientation to general flat horizontal orientation after their travel through the electroless bath, followed by the steps of rinsing the boards after their transfer back to general horizontal orientation and then drying the boards, as they travel along a generally horizontal path, while being in generally flat horizontal orientation, and while they are moving substantially continuously at a rate of travel at least as great as the first rate of travel, and including the electroplating step of applying a metallic coating to the thin metallic coating that was applied in the electroless bath, by delivering the boards serially and substantially continuously through an electroplating bath comprising copper sulfate, sulfuric acid and sodium chloride.

13. Apparatus for deposition of metal onto surfaces of generally flat articles, comprising:
(a) means for receiving the articles with at least some generally flat exterior surfaces having portions generally of non-metallic surface construction;
(b) means for continuously and serially delivering the articles along a predetermined path;
(c) means for preparing the articles for electroless metal deposition on surface portions as they are continuously delivered along their predetermined path, by application of at least one chemical solution and at least one rinse thereto;
(d) wherein the delivering means includes means for moving the articles in generally flat horizontal orientation along a generally horizontal path at a first rate of travel for at least a portion of the travel of articles along their predetermined path prior to the delivery of articles into an electroless deposition bath;
(e) means for transferring the articles from generally flat horizontal orientation to generally vertical orientation as they are delivered along their predetermined path; and (f) means for substantially continuously moving the articles in serial surface-facing-surface relation while in their generally vertical orientation along a generally horizontal path through a bath of electroless metallic solution at a second rate of travel substantially slower than the first rate of travel, to apply a thin metallic coating thereto.

14. The apparatus of claim 13, including means for transferring the articles from generally vertical orientation to generally flat horizontal orientation, after their travel through the bath.

15. The apparatus of claim 13, including means for at least rinsing and drying the articles as they travel along their predetermined path subsequent to their movement through the bath, and while they are moving substantially continuously at a rate of travel at least as great as the first rate of travel.

16. The apparatus of claim 14, including means for rinsing the articles after their transfer back to generally horizontal orientation and drying the articles, as they travel along a generally horizontal path, while being in generally flat horizontal orientation, and while they are moving substantially continuously at a rate of travel at least as great as the first rate of travel.

17. The apparatus of claim 13, including means for electroplating the articles by applyiong a metallic coating to the thin metallic coating that was applied in the electroless bath, by delivering the articles through an electroplating solution.

18. The apparatus of claim 17, wherein the electroplating means includes means for serially and substantially continuously conveying the articles through an electroplating bath.

19. The apparatus of claim 13, wherein the means for preparing the articles includes means for application of a chemical reducer solution to at least the non-metallic surface portions of the articles to promote metal coverage thereon.

20. The apparatus of claim 19, wherein the means for preparing the articles includes means for application of a chemical activator solution onto at least the non-metallic surface portions of the articles prior to the application of the reducer solution thereto.

21. The apparatus of claim 13, wherein the boards are printed circuit boards having at least some through-holes having non-metallic portions and wherein the means for preparing the boards includes means for application of a chemical activator solution comprising palladium chloride, sodium hydroxide, boric acid, and a complex builder to at least the non-metallic surface portions of the boards, and means for applying a chemical reducer solution comprising sodium borohydride and sodium hypophosphate to at least the non-metallic surface portions of the boards to promote copper coverage thereon, wherein the means for applying an electroless metallic solution comprises means for applying a solution of cupric chloride, eythylene diamine tetra acetic acid, sodium hydroxide, formaldehyde and a stabilizer, including means for transferring the boards from general vertical orientation to general flat horizontal orientation after their travel through the electroless bath, followed by means for rinsing the boards after their transfer back to general horizontal orientation and then drying the boards as they travel along a generally horizontal path, while being in generally flat horizontal orientation, and while they are moving substantially continuously at a rate of travel at least as great as the first rate of travel, and including electroplating means for applying a metallic coating to the thin metallic coating that was applied in the electroless bath, by delivering the boards serially and substantially continuously through an electroplating bath comprising copper sulfate, sulfuric acid and sodium chloride.

* * * * *

UNITED STATES PATENT AND TRADEMARK OFFICE
CERTIFICATE OF CORRECTION

PATENT NO. : 4,576,685
DATED : March 18, 1986
INVENTOR(S) : Goffredo et al.

It is certified that error appears in the above—identified patent and that said Letters Patent is hereby corrected as shown below:

ABSTRACT, Line 16: "with" should be --which--.

Column 7, line 67, delete duplication of "20-80 grams/liter".

Signed and Sealed this

Fifteenth Day of July 1986

[SEAL]

Attest:

Attesting Officer

DONALD J. QUIGG

Commissioner of Patents and Trademarks